United States Patent
Li et al.

(10) Patent No.: US 8,226,073 B2
(45) Date of Patent: Jul. 24, 2012

(54) TESTING APPARATUS

(75) Inventors: Shen-Chun Li, Taipei Hsien (TW); Shou-Kuo Hsu, Taipei Hsien (TW); Yung-Chieh Chen, Taipei Hsien (TW); Hsien-Chuan Liang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 261 days.

(21) Appl. No.: 12/699,898

(22) Filed: Feb. 4, 2010

(65) Prior Publication Data
US 2011/0140332 A1 Jun. 16, 2011

(30) Foreign Application Priority Data
Dec. 14, 2009 (CN) .......................... 2009 1 0311368

(51) Int. Cl.
*B25B 1/24* (2006.01)
(52) U.S. Cl. ............................. 269/74; 269/55; 269/71
(58) Field of Classification Search ................... 269/74, 269/55, 56, 60, 71, 17, 903
See application file for complete search history.

(56) References Cited

U.S. PATENT DOCUMENTS

| | | | | | |
|---|---|---|---|---|---|
| 4,611,846 | A | * | 9/1986 | Feiber et al. | 294/207 |
| 4,886,412 | A | * | 12/1989 | Wooding et al. | 414/416.05 |
| 6,942,139 | B2 | * | 9/2005 | Lipnevicius | 228/102 |
| 7,725,212 | B2 | * | 5/2010 | Prasse | 700/214 |
| 7,783,383 | B2 | * | 8/2010 | Eliuk et al. | 700/245 |
| 2011/0140332 | A1 | * | 6/2011 | Li et al. | 269/74 |

* cited by examiner

*Primary Examiner* — Lee D Wilson
(74) *Attorney, Agent, or Firm* — Altis Law Group, Inc.

(57) ABSTRACT

A testing apparatus is for testing products on an assembly line and includes a worktable, a positioning device, and a testing member. The worktable includes a number of wheels pivotably attached to a bottom thereof, and a number of retractable feet attached to the bottom thereof. The positioning device is attached to the worktable and includes a number of clamping members to position a product to be test. The testing member is attached to the worktable and operated by a control box to move a robot arm with a testing head to test the product.

15 Claims, 7 Drawing Sheets

TESTING APPARATUS

BACKGROUND

1. Technical Field

The present disclosure relates to testing apparatuses and, particularly to a testing apparatus which can readily test products on an assembly line.

2. Description of Related Art

Electronic products (such as circuit boards) are required to be tested before shipments or transferring to next workstations. However, typical testing apparatuses are often installed in fixed places, such as testing labs. It is inefficient to carry the products from an assembly line to the test labs before testing and back to the assembly line after testing.

DETAILED DESCRIPTION

Figure 1:
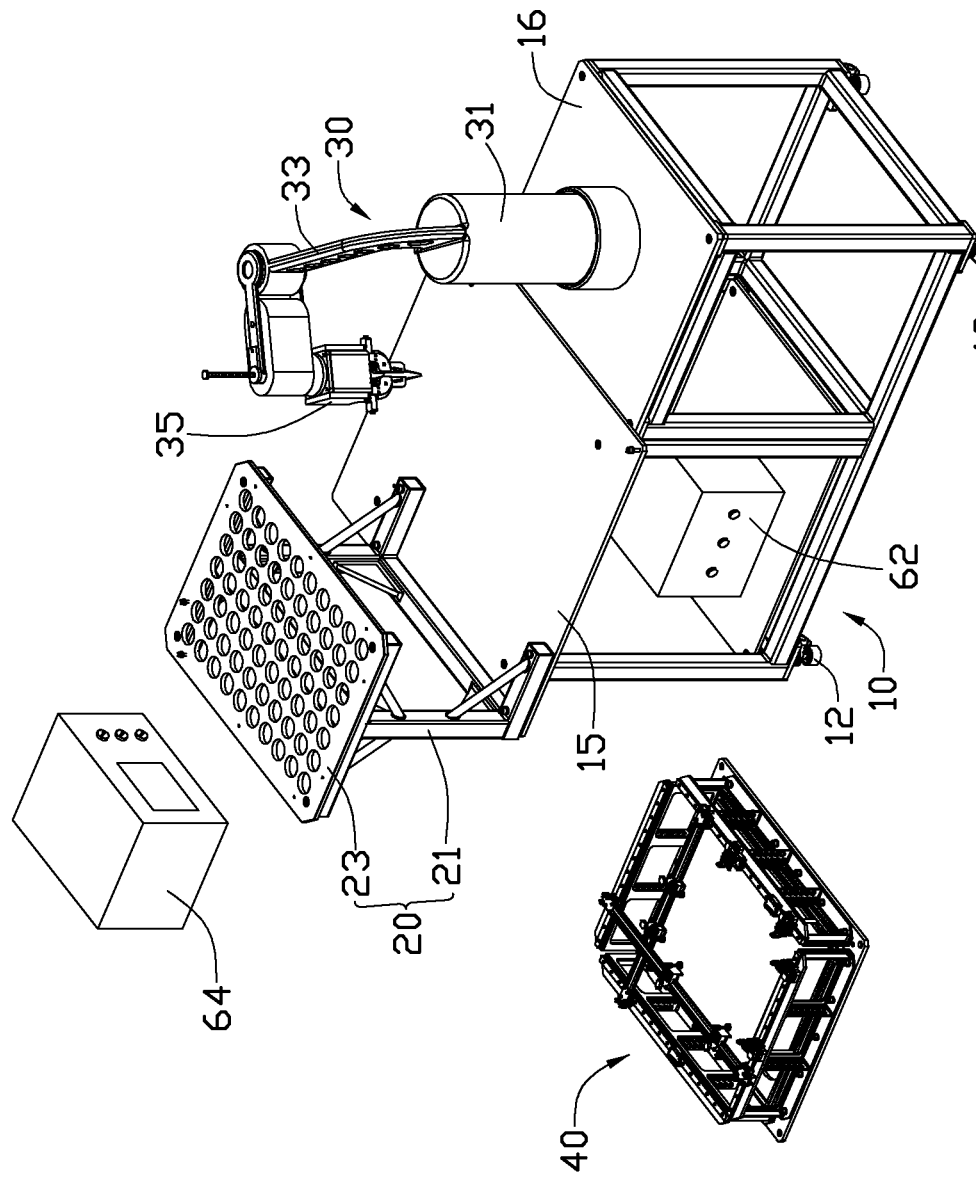
FIG. 1 is an exploded, isometric view of a testing apparatus according to an exemplary embodiment.

Referring to FIG. 1, an exemplary embodiment of a testing apparatus includes a worktable 10, a supporting member 20, a testing member 30, a positioning device 40, a control box 62, and an indicator 64.

The worktable 10 is generally similar to cuboid structure. The worktable 10 includes a first top wall 15, and a second top wall 16. The first top wall 15 is higher than the second top wall 16. The worktable 10 includes four wheels 13 pivotally attached to four corners of the bottom thereof and four retractable feet 14 extending from the bottom adjacent to the wheels 13, respectively. The control box 62 is situated on an inside of a bottom wall of the worktable 10.

The support member 20 includes a frame 21 attached to the first top wall 15 of the worktable 10, and a supporting panel 23 formed at a top of the frame 21 for supporting the indicator 64.

The testing member 30 includes a pedestal 31 attached to the second top wall 16 of the worktable 10, a robot arm 33 extending from the pedestal 31, and a testing head 35 formed at a distal end of the robot arm 33. The testing head 35 includes a probe electronically connected to the indicator 64. The robot arm 33 is operated by the control box 62.

Figure 2:
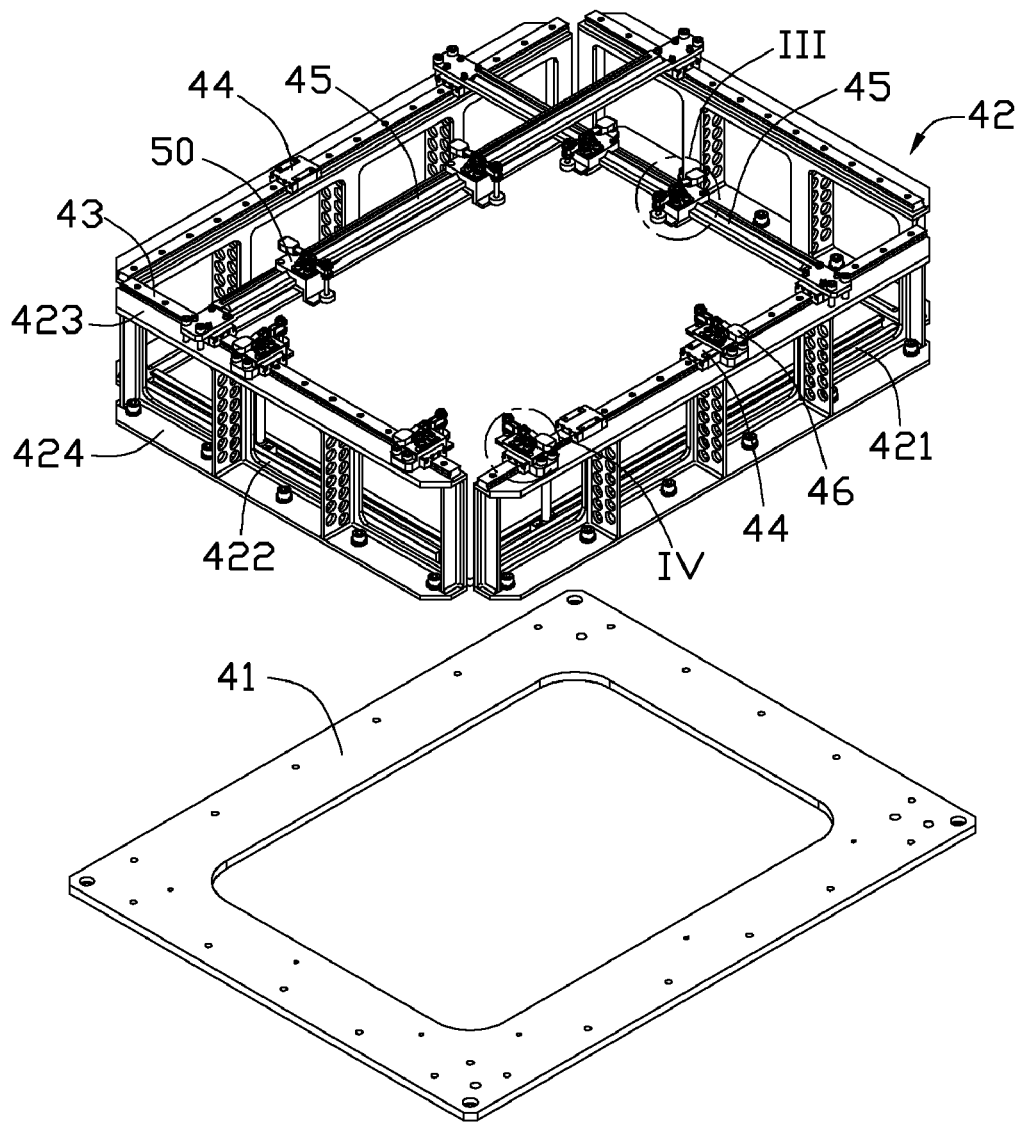
FIG. 2 is an exploded, isometric view of a positioning member of the testing apparatus of FIG. 1.
Figure 3:
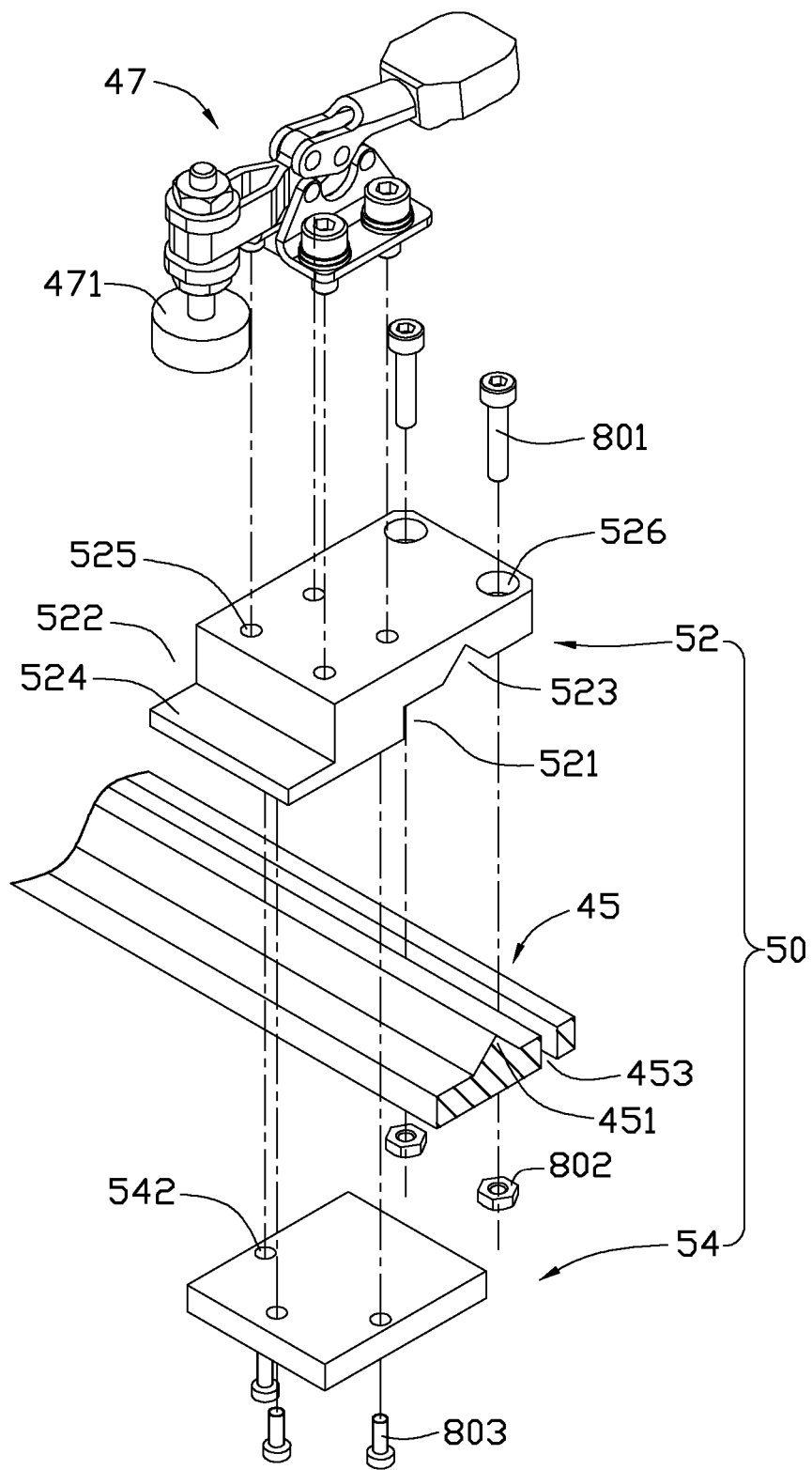
FIG. 3 is an enlarged, exploded isometric view of the circled portion III of FIG. 2.
Figure 4:
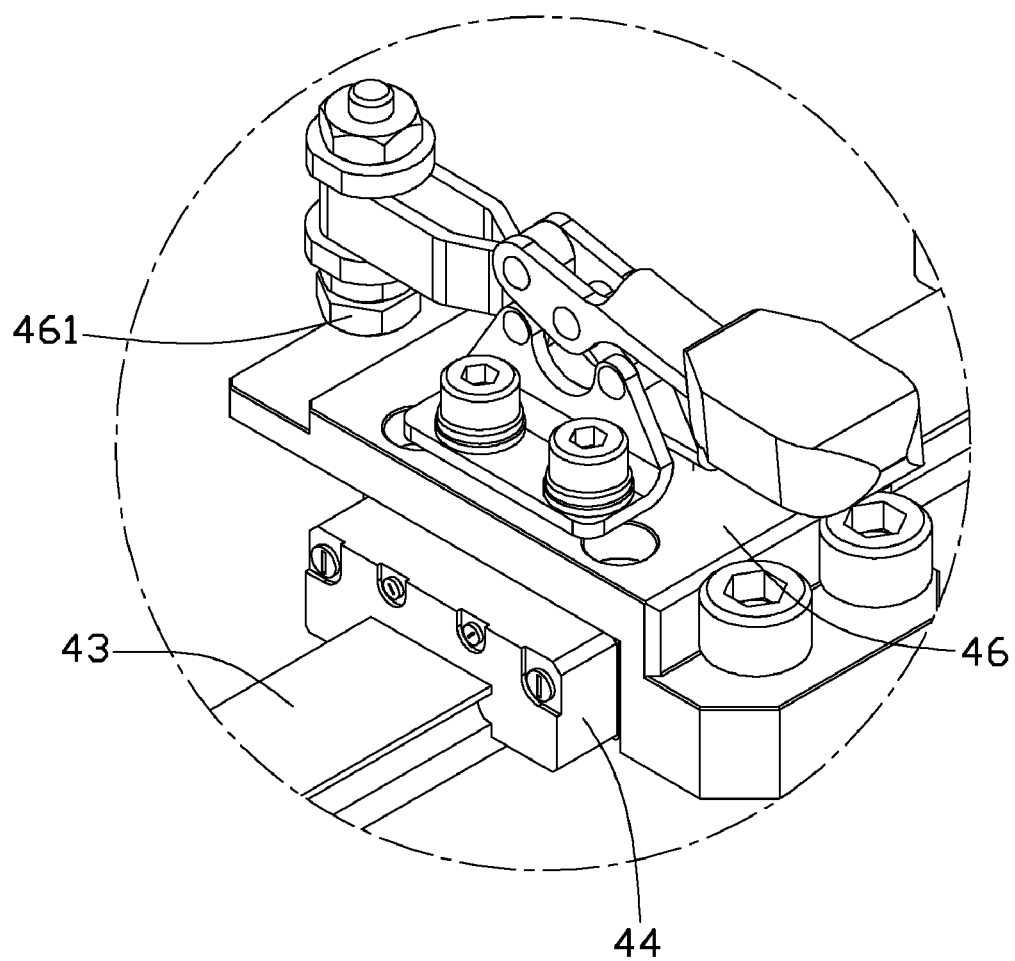
FIG. 4 is an enlarged, isometric view of the circled portion IV of FIG. 2.

Referring to FIGS. 2 to 4, the positioning device 40 includes a board 41, and a bracket 42 attached to the board 41. The bracket 42 and the board 41 are both rectangular. The bracket 42 includes a pair of first sidewalls 421, and a pair of second sidewalls 422 perpendicular to the first sidewalls 421. The first sidewalls 421 are lower than the second sidewalls 422. A top flange 423 and a bottom flange 424 extend from a top edge and a bottom edge of each of the first sidewalls 421 and second sidewalls 422, respectively. A rail 43 extrudes from each of the top flanges 423. Two beams 45 are slidably attached to two pairs of the rails 43 of the first sidewalls 421 and the second sidewalls 422 by sliders 44. A plurality of first clamping members 47 is attached to beams 45 by a plurality of fixing members 50. Each of the first clamping members 47 includes a clamp head 471. A plurality of second clamping members 46 are attached to the rails 43 by the sliders 44. Each of the second clamping members 46 includes a clamp head 463. The first clamping members 47 and the second clamping members 46 are push/pull toggle clamps.

Each of the fixing members 50 includes a fixing block 52, and a fixing tab 54. Referring to FIG. 3, each of the beams 45 includes a slot 453 defined therein along the extension direction, and a triangular cross-section ridge 451 extruding from a top thereof along the slot 453. The fixing block 52 includes a first rectangular recess 521 defined in a top-left portion thereof, and a second rectangular recess 522 defined in a bottom-right portion thereof. An extension tab 524 is formed below a bottom wall of the second recess 522, with a plurality of mounting holes defined in a bottom portion thereof (not shown). A triangular cross-section groove 523 is defined in the fixing block 52 above a top wall of the second recess 522, for slidably engaging with the ridge 451 of the beam 45. Two first fixing holes 526 and four second fixing holes 525 are defined in the fixing block 52 beside the groove 523, respectively. The fixing tab 54 includes a plurality of fixing holes 542 defined therein.

To attach any one of the first clamping members 47 to one of the beams 45, the beam 45 is received in the first recess 521 of the fixing block 52, with a left side of the beam 45 contacting a portion of the fixing block 45 located at a left side of the first recess 521. The ridge 451 is slidably received in the groove 524, with the slot 453 in alignment with the two first fixing holes 526. A pair of threaded rods 801 extends through the first fixing holes 526 and the slot 453 of the beam 45 to engage with a pair of nuts 802. A top of the fixing tab 471 abuts a bottom of the beam 45 and the bottom of the extension tab 524 of the fixing block 52. A plurality of conventional fasteners (such as screws) extends through the fixing holes 542 of the fixing tab 54 to engage in the mounting holes of the extension tab 524. The first clamping member 47 is placed on a top of the fixing block 52, with a plurality of fasteners extending through the first clamping member 47 to engage in the second fixing holes 525 of the fixing block 52. Any one of the second clamping members 46 is attached to the slider 44 by conventional fasteners. The board 41 is attached to the bottom flanges 424 of the bracket 42 by conventional fasteners, for supporting a product, such as a circuit board 900 (shown in FIG. 6 and FIG. 7).

Figure 5:
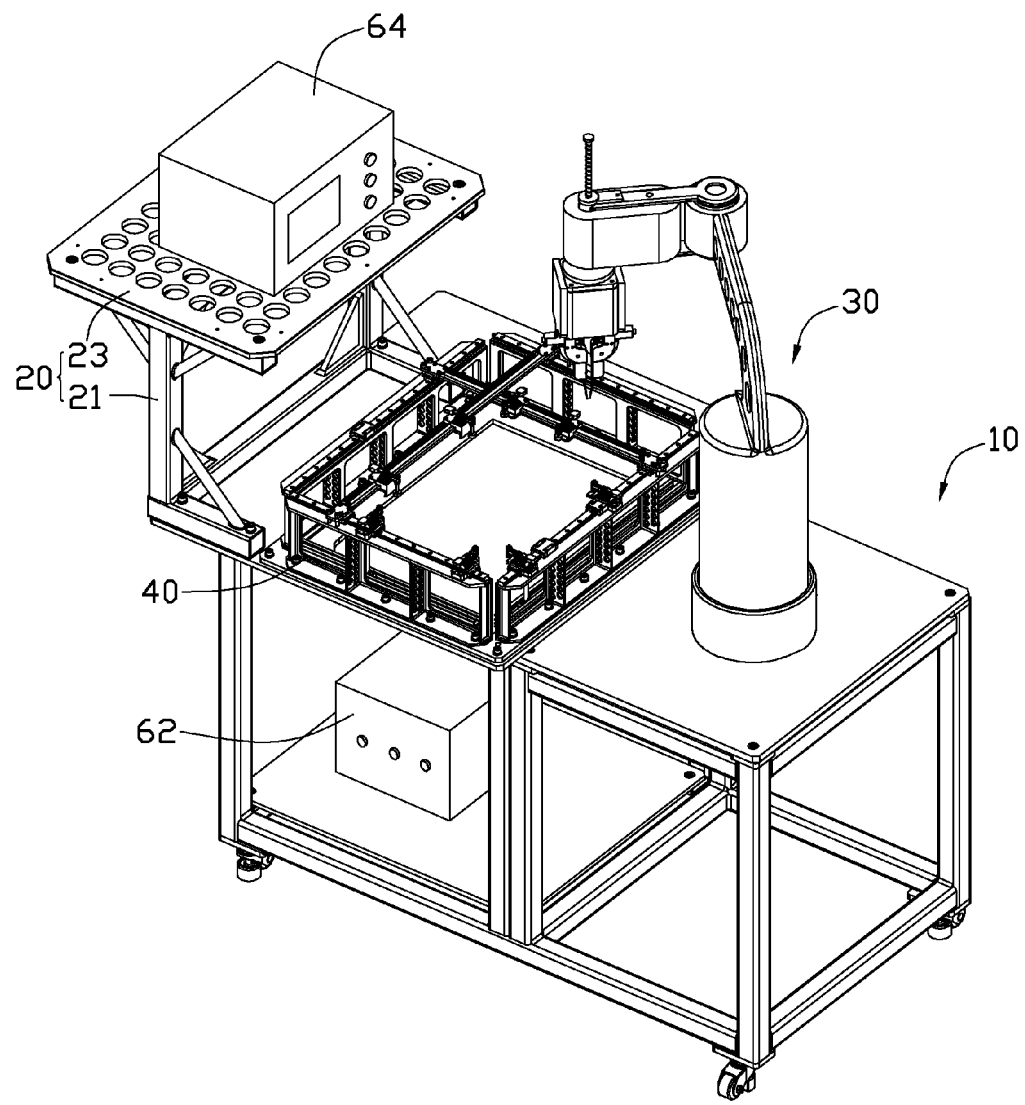
FIG. 5 is an assembled view of the testing apparatus of FIG. 1.

Referring to FIG. 5, the positioning device 40 is located between the supporting member 20 and the testing member 30, with the board 41 of the positioning device abutting the first load wall 15 of the worktable 10. A plurality of conventional fasteners attaches the positioning device 40 to the worktable 10. The testing head 35 of the testing member 30 is capable of freely moving above the positioning device 40. The probe of the testing member 30, the control box 62, and the indicator 64 are electronically connected.

Figure 6:
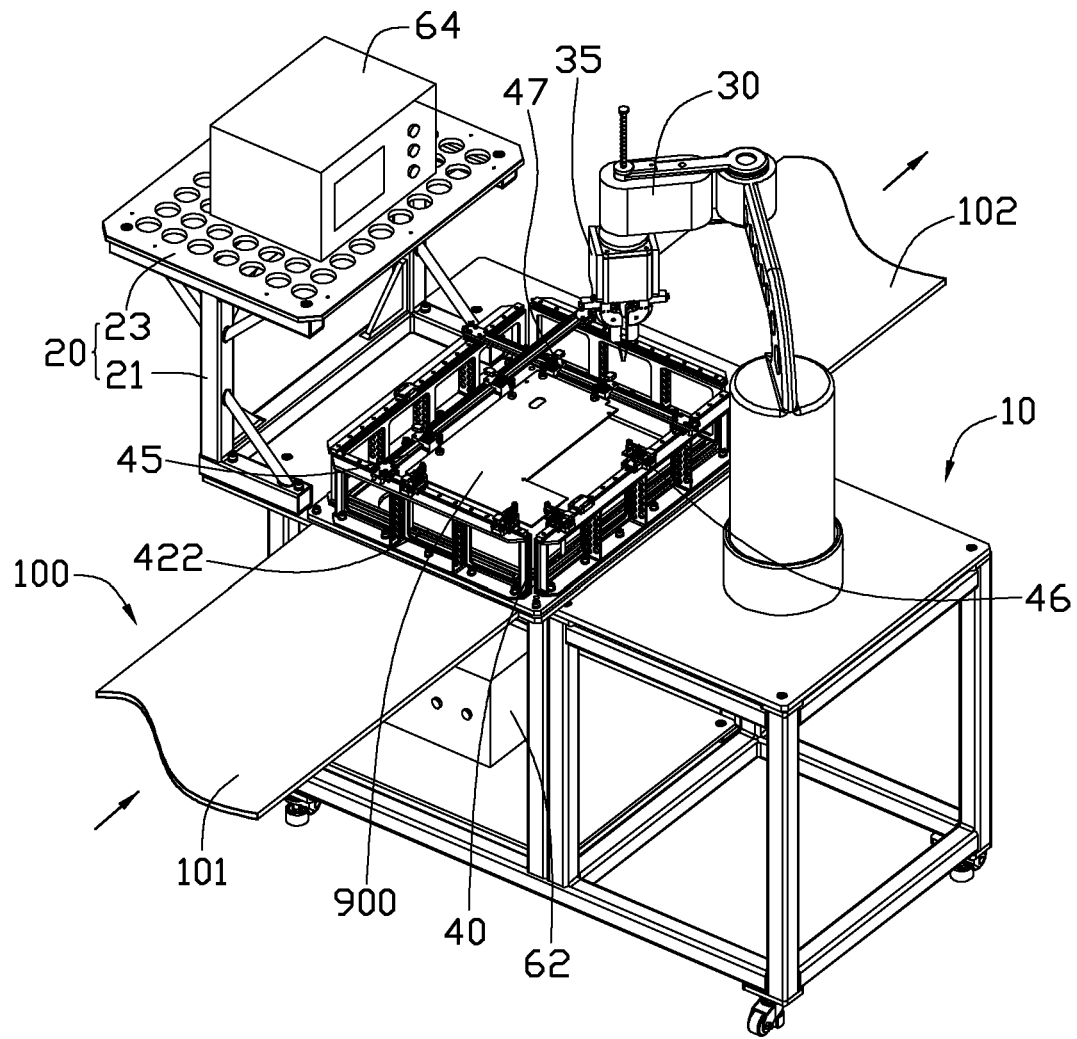
FIG. 6 is a schematic view of the testing apparatus of FIG. 5 being used on a first type of assembly line.

Referring to FIG. 6, the testing apparatus can be used in a first type of assembly line 100. The assembly line 100 includes a first line 101, and a second line 102 in alignment with the first line 101. The feet 14 are retracted into the worktable 10 and the wheels 13 are pivoted to contact a floor or a base, to move the testing apparatus to the first assembly line 100. The first line 101 and the second line 102 are respectively located beside the second sidewalls 424 of the positioning device 40. The feet 14 are extended to support the worktable 100. The product 900 is conveyed to the testing apparatus by the first line 101 and placed on the board 41 of the positioning device 40. The beams 45 and the sliders 44 are slidably moved to position the product 900, with the clamp head 471, 463 of the first clamping members 47 and the second clamping members 46 retaining the product 900 on the board 41. The testing head 35 is operated by the control box 62 to test the product 900. When the testing is completed, the product 900 is taken out of the positioning device 40 to be placed on the second line 102. The indicator 64 shows testing results.

Figure 7:
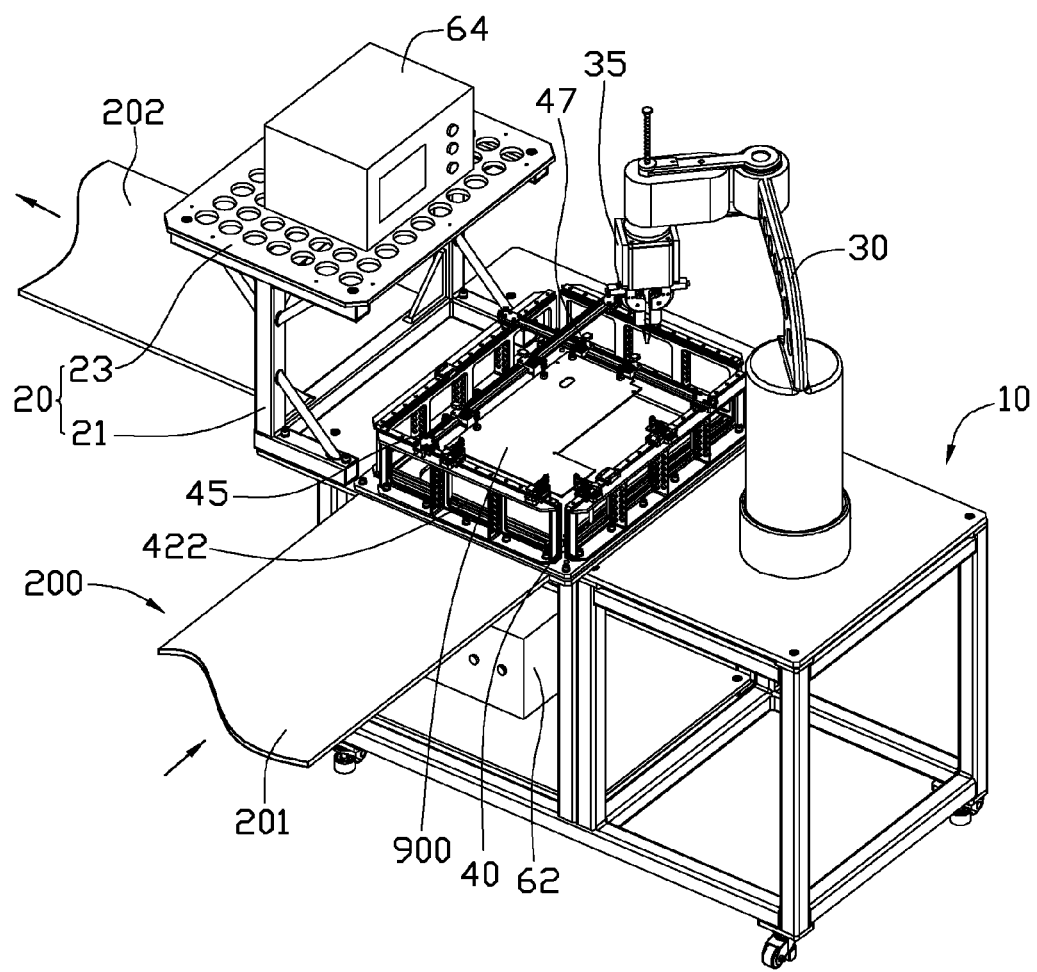
FIG. 7 is similar to FIG. 6, but shows the testing apparatus of FIG. 5 being used on a second type of assembly line.

Referring to FIG. 7, the testing apparatus can also be used in a second type of assembly line 200. The assembly line 200 includes a first line 201, and a second line 202 perpendicular to the first line 201. The testing apparatus is moved to the testing apparatus, with the first line 201 located near one of the second sidewalls 424 of the positioning device 40 and the second line 102 located near the supporting member 20. The first line 201 transfers the product 900 to the testing apparatus before testing and the second line 202 transfers the tested product 900 away from the testing apparatus when the testing is completed.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A testing apparatus comprising:
   a worktable comprising a plurality wheels pivotably attached to a bottom thereof, and a plurality of retractable feet attached to the bottom;
   a positioning device attached to a top of the worktable and comprising a plurality of first and second clamping members for positioning a product to be tested; and
   a testing member attached to the worktable adjacent the positioning device and comprising a robot arm controlled by a control box, the robot arm comprising a testing head for testing the product;
   wherein the positioning device comprises a board, and a bracket attached to the board.

2. The testing apparatus as claimed in claim 1, wherein the worktable is generally a cuboid structure in shape, a supporting member is attached the top of the worktable beside the positioning device to support an indicator for showing a test result.

3. The testing apparatus as claimed in claim 1, wherein the wheels and the feet are attached to corners of an outside the bottom of the worktable.

4. The testing apparatus as claimed in claim 3, wherein the control box is attached to an inside of the bottom of the worktable.

5. The testing apparatus as claimed in claim 1, wherein the bracket comprises two pairs of sidewalls with different height, two beams are slidably attached to the two pairs of sidewalls.

6. The testing apparatus as claimed in claim 5, wherein a flange extends from a top edge of each of the sidewalls, a rail is formed on each of the flanges, a plurality of sliders slidably rides on the rails, the beams and the second clamping members are slidably attached to the rails by the sliders.

7. The testing apparatus as claimed in claim 1, wherein the first and second clamping members are push/pull toggle clamps.

8. The testing apparatus as claimed in claim 6, wherein the first clamping members are attached to the beams by a plurality fixing members.

9. The testing apparatus as claimed in claim 8, wherein each of the beams comprises a ridge extruding therefrom along an extension direction thereof, the fixing member comprises a fixing block, the fixing block comprises a recess defined therein to receive the beam and a groove defined beside the recess to slidably receive the ridge.

10. The testing apparatus as claimed in claim 9, wherein the beam comprises a slot defined therein along the ridge, the fixing block comprises a pair of first fixing through holes defined beside one side of the groove, a pair of screws extends through the fixing holes and the slot to engage with a pair of nuts to attach the fixing block to the beam.

11. The testing apparatus as claimed in claim 9, wherein the ridge and the groove have triangular cross-sections.

12. The testing apparatus as claimed in claim 9, wherein the fixing member comprises a fixing tab, the fixing block further comprises an extension tab located away from the recess, the fixing tab abuts the beam and the extension tab, the fixing tab is attached to the extension tab by fasteners.

13. The testing apparatus as claimed in claim 10, wherein the fixing block comprises a plurality of second fixing holes defined beside the other side of the groove, for attaching the first clamping member thereto by fasteners extending the first clamping member to engage in the second fixing holes.

14. A testing apparatus comprising:
   a worktable comprising a plurality wheels pivotably attached to a bottom thereof, and a plurality of retractable feet attached to the bottom;
   a positioning device attached to a top of the worktable and comprising a plurality of first and second clamping members for positioning a product to be tested; and
   a testing member attached to the worktable adjacent the positioning device and comprising a robot arm controlled by a control box, the robot arm comprising a testing head for testing the product;
   wherein the worktable is generally a cuboid structure in shape, a supporting member is attached the top of the worktable beside the positioning device to support an indicator for showing a test result.

15. A testing apparatus comprising:
   a worktable comprising a plurality wheels pivotably attached to a bottom thereof, and a plurality of retractable feet attached to the bottom;
   a positioning device attached to a top of the worktable and comprising a plurality of first and second clamping members for positioning a product to be tested; and
   a testing member attached to the worktable adjacent the positioning device and comprising a robot arm controlled by a control box, the robot arm comprising a testing head for testing the product;
   wherein the worktable is generally a cuboid structure in shape, a supporting member is attached the top of the worktable beside the positioning device to support an indicator for showing a test result;
   wherein the first and second clamping members are push/pull toggle clamps.

* * * * *